United States Patent
Sun

(10) Patent No.: US 10,403,210 B2
(45) Date of Patent: Sep. 3, 2019

(54) SHIFT REGISTER AND DRIVING METHOD, DRIVING CIRCUIT, ARRAY SUBSTRATE AND DISPLAY DEVICE

(71) Applicant: BOE TECHNOLOGY GROUP CO., LTD., Beijing (CN)

(72) Inventor: Tuo Sun, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 22 days.

(21) Appl. No.: 15/528,030

(22) PCT Filed: May 11, 2016

(86) PCT No.: PCT/CN2016/081645
§ 371 (c)(1),
(2) Date: May 18, 2017

(87) PCT Pub. No.: WO2017/156850
PCT Pub. Date: Sep. 21, 2017

(65) Prior Publication Data
US 2018/0114490 A1    Apr. 26, 2018

(30) Foreign Application Priority Data
Mar. 16, 2016    (CN) .......................... 2016 1 0151132

(51) Int. Cl.
*G09G 3/36* (2006.01)
*G11C 19/28* (2006.01)
*G09G 3/3266* (2016.01)

(52) U.S. Cl.
CPC ......... *G09G 3/3266* (2013.01); *G09G 3/3674* (2013.01); *G11C 19/28* (2013.01); *G09G 2310/0286* (2013.01)

(58) Field of Classification Search
CPC ............................................. G09G 2310/0286
See application file for complete search history.

(56) References Cited

U.S. PATENT DOCUMENTS 7,366,274 B2    4/2008    Tseng et al.
7,786,972 B2 *  8/2010    Jeong .................. G09G 3/3266
                                                             345/100
(Continued)

FOREIGN PATENT DOCUMENTS

CN    102867543 A    1/2013
CN    103280200 A    9/2013
(Continued)

OTHER PUBLICATIONS

English translation of PCT International Search Report, Application No. PCT/CN2016/081645, dated Dec. 21, 2016, 3 pgs.
(Continued)

*Primary Examiner* — Patrick F Marinelli
(74) *Attorney, Agent, or Firm* — Armstrong Teasdale LLP

(57) ABSTRACT

Embodiments of the present disclosure provide a shift register and a driving method, a driving circuit, an array substrate, and a display device. The shift register includes a pull-up control module, a pull-up module, a pull-down control module, a pull-down module, and an output terminal. The pull-up control module is connected to the pull-up module and configured to control the pull-up module to pull up the electric level of the output terminal. The pull-up module is connected to the output terminal and configured to pull up the electric level of the output terminal. The pull-down control module is connected to the pull-down module and configured to control the pull-down module to pull down the electric level of the output terminal. The pull-down module is connected to the output terminal and configured to pull down the electric level of the output terminal.

15 Claims, 3 Drawing Sheets

(56) References Cited

U.S. PATENT DOCUMENTS

| | | | | |
|---|---|---|---|---|
| 8,019,039 B1* | 9/2011 | Tsai | ............... | G11C 19/28 377/64 |
| 8,462,097 B2* | 6/2013 | Kim | ............... | G09G 3/3677 345/100 |
| 9,208,734 B2* | 12/2015 | Qian | ............... | G11C 19/28 |
| 9,330,593 B2* | 5/2016 | Jang | ............... | G09G 3/32 |
| 9,437,325 B2* | 9/2016 | Qian | ............... | G11C 19/184 |
| 9,530,355 B2* | 12/2016 | Sun | ............... | G09G 3/3266 |
| 9,679,514 B2* | 6/2017 | Wu | ............... | G09G 3/3225 |
| 9,875,706 B1* | 1/2018 | Gong | ............... | G09G 3/36 |
| 9,875,708 B2* | 1/2018 | Zou | ............... | G09G 3/3266 |
| 9,916,805 B2* | 3/2018 | Li | ............... | G09G 3/2092 |
| 10,043,586 B2* | 8/2018 | Ma | ............... | G11C 19/28 |
| 2007/0171115 A1* | 7/2007 | Kim | ............... | G09G 3/3677 341/155 |
| 2008/0001904 A1* | 1/2008 | Kim | ............... | G09G 3/3677 345/100 |
| 2008/0062097 A1* | 3/2008 | Jeong | ............... | G09G 3/3266 345/84 |
| 2010/0164854 A1* | 7/2010 | Kim | ............... | G09G 3/3677 345/100 |
| 2010/0207968 A1* | 8/2010 | Kim | ............... | G09G 3/3266 345/691 |
| 2011/0227884 A1* | 9/2011 | Chung | ............... | G09G 3/3266 345/204 |
| 2011/0234577 A1 | 9/2011 | Yang et al. | | |
| 2012/0176417 A1* | 7/2012 | Jang | ............... | G09G 3/3266 345/690 |
| 2014/0062848 A1* | 3/2014 | Jinta | ............... | G09G 3/3233 345/100 |
| 2014/0078029 A1* | 3/2014 | Jang | ............... | G09G 3/32 345/82 |
| 2014/0079176 A1* | 3/2014 | Qian | ............... | G11C 19/28 377/77 |
| 2015/0043704 A1* | 2/2015 | Ma | ............... | G09G 3/3677 377/68 |
| 2015/0325190 A1 | 11/2015 | Cao | | |
| 2015/0340102 A1* | 11/2015 | Qian | ............... | G11C 19/184 377/54 |
| 2015/0379926 A1* | 12/2015 | Wu | ............... | G09G 3/3225 345/215 |
| 2016/0189586 A1* | 6/2016 | Zou | ............... | G09G 3/3266 345/213 |
| 2016/0189626 A1* | 6/2016 | Sun | ............... | G09G 3/3266 345/212 |
| 2016/0217870 A1* | 7/2016 | Tseng | ............... | G11C 19/28 |
| 2016/0225341 A1* | 8/2016 | Ma | ............... | G09G 3/20 |
| 2016/0372041 A1* | 12/2016 | Sun | ............... | G09G 3/20 |
| 2016/0372070 A1* | 12/2016 | Hu | ............... | G09G 3/3614 |
| 2017/0287393 A1* | 10/2017 | Ma | ............... | G11C 19/28 |
| 2017/0345366 A1* | 11/2017 | Jang | ............... | G09G 3/3674 |
| 2018/0033388 A1* | 2/2018 | Gong | ............... | G09G 3/36 |
| 2018/0033389 A1* | 2/2018 | Li | ............... | G09G 3/2092 |
| 2018/0075810 A1* | 3/2018 | Kim | ............... | G09G 3/3233 |
| 2018/0114490 A1* | 4/2018 | Sun | ............... | G09G 3/3266 |
| 2018/0130541 A1* | 5/2018 | Li | ............... | G09G 5/003 |
| 2018/0174503 A1* | 6/2018 | Shim | ............... | G11C 19/184 |

FOREIGN PATENT DOCUMENTS

| | | |
|---|---|---|
| CN | 103426414 A | 12/2013 |
| CN | 103985341 A | 8/2014 |
| CN | 104134430 A | 11/2014 |
| CN | 105225635 A | 1/2016 |
| CN | 205050536 U | 2/2016 |
| KR | 2010021020 A | 2/2010 |

OTHER PUBLICATIONS

PCT Written Opinion, Application No. PCT/CN2016/081645, dated Dec. 21, 2016, 5 pgs.: with English translation.

China First Office Action, Application No. 201610151132.3, dated Aug. 11, 2017, 12 pgs.: with English translation.

* cited by examiner

SHIFT REGISTER AND DRIVING METHOD, DRIVING CIRCUIT, ARRAY SUBSTRATE AND DISPLAY DEVICE

CROSS REFERENCE TO RELATED APPLICATIONS

This patent application is a National Stage Entry of PCT/CN2016/081645 filed on May 11, 2016, which claims the benefit and priority of Chinese Patent Application No. 201610151132.3 filed on Mar. 16, 2016, the disclosures of which are incorporated by reference herein in their entirety as part of the present application.

BACKGROUND

The present disclosure relates to display technology, and in particular, to a shift register and a driving method, a driving circuit, an array substrate, and a display device.

The driving demand for a pixel circuit using an Active Matrix Organic Light Emitting Diode (AMOLED) is different from the driving demand for a pixel circuit in a conventional Active Matrix Liquid Crystal Display (AMLCD). In an AMOLED pixel circuit with compensation function, at least one shift register is required to control the process of writing a data signal to the pixel circuit.

FIG. 1 is a schematic circuit diagram of a shift register of AMOLED in the prior art. As shown in FIG. 1, a scanning line shift register commonly used in the prior art includes seven transistors and two capacitors (7T2C), which are complicated in structure and require more signals.

BRIEF DESCRIPTION

Embodiments of the present disclosure provide a shift register and a driving method, a gate driving circuit, an array substrate, and a display device, which simplify the circuit structure and may be applied to a narrow bezel or a screen with ultra-high resolution.

A first aspect of the present disclosure provides a shift register including a pull-up control module, a pull-up module, a pull-down control module, a pull-down module, and an output terminal. The pull-up control module is connected to the pull-up module and configured to control the pull-up module to pull up the electric level of the output terminal. The pull-up module is connected to the output terminal and configured to pull up the electric level of the output terminal. The pull-down control module is connected to the pull-down module and configured to control the pull-down module to pull down the electric level of the output terminal. The pull-down module is connected to the output terminal and configured to pull down the electric level of the output terminal.

In an embodiment of the present disclosure, the pull-up control module includes a control terminal, a first terminal, and a second terminal. The pull-up module includes a control terminal, a first terminal, and a second terminal. The pull-down control module includes a control terminal, a first terminal, and a second terminal. The pull-down module includes a control terminal, a first terminal, and a second terminal. The control terminal of the pull-up control module is connected to a clock signal terminal, the first terminal of the pull-up control module is connected to a first input terminal, and the second terminal of the pull-up control module is connected to the control terminal of the pull-up module. The first terminal of the pull-up module is connected to a first voltage terminal and the second terminal of the pull-up module is connected to the output terminal. The control terminal of the pull-down control module is connected to the second terminal of the pull-up control module, the first terminal of the pull-down control module is connected to the second input terminal, and the second terminal of the pull-down control module is connected to the control terminal of the pull-down module. The first terminal of the pull-down module is connected to a second voltage terminal, and the second terminal of the pull-down module is connected to the output terminal.

In an embodiment of the present disclosure, the second voltage terminal is connected to the clock signal terminal.

In an embodiment of the present disclosure, the pull-up control module includes a first transistor. The control terminal of the first transistor is the control terminal of the pull-up control module, the first terminal of the first transistor is the first terminal of the pull-up control module, and the second terminal of the first transistor is the second terminal of the pull-up control module.

In an embodiment of the present disclosure, the pull-up module includes a second transistor and a first capacitor. The control terminal of the second transistor is the control terminal of the pull-up module, the first terminal of the second transistor is the first terminal of the pull-up module, and the second terminal of the second transistor is the second terminal of the pull-up module. The first capacitor is connected between the control terminal and first terminal of the second transistor.

In an embodiment of the present disclosure, the pull-down control module includes a third transistor. The control terminal of the third transistor is the control terminal of the pull-down control module, the first terminal of the third transistor is the first terminal of the pull-down control module, and the second terminal of the third transistor is the second terminal of the pull-down control module.

In an embodiment of the present disclosure, the pull-down module includes a fourth transistor and a second capacitor. The control terminal of the fourth transistor is the control terminal of the pull-down module, the first terminal of the fourth transistor is the first terminal of the pull-down module, and the second terminal of the fourth transistor is the second terminal of the pull-down module. The second capacitor is connected between the control terminal and second terminal of the fourth transistor.

A second aspect of the present disclosure provides a gate driving circuit including a plurality of shift registers above mentioned and connected in cascade, wherein the output terminal of the shift register is configured to provide a gate driving signal to the corresponding pixel circuit. Wherein the pull-up control module and the output terminal of a shift register at one stage are connected to a shift register at next stage.

In an embodiment of the present disclosure, the pull-up control module includes a control terminal, a first terminal, and a second terminal. The pull-up module includes a control terminal, a first terminal, and a second terminal. The pull-down control module includes a control terminal, a first terminal, and a second terminal. The pull-down module includes a control terminal, a first terminal, and a second terminal. The control terminal of the pull-up control module is connected to a clock signal terminal, the first terminal of the pull-up control module is connected to a first input terminal, and the second terminal of the pull-up control module is connected to the control terminal of the pull-up module. The first terminal of the pull-up module is connected to a first voltage terminal and the second terminal of the pull-up module is connected to the output terminal. The control terminal of the pull-down control module is connected to the second terminal of the pull-up control module, the first terminal of the pull-down control module is connected to a second input terminal, and the second terminal of the pull-down control module is connected to the control terminal of the pull-down module. The first terminal of the pull-down module is connected to a second voltage terminal, and the second terminal of the pull-down module is connected to the output terminal. Wherein the second terminal of the pull-up control module of a shift register at one stage is connected to the first input terminal of a shift register at next stage, and the output terminal of the shift register at one stage is connected to the second input terminal of the shift register at next stage.

A third aspect of the present disclosure provides an array substrate including the gate driving circuit described above.

A fourth aspect of the present disclosure provides a display device including the array substrate described above.

A fifth aspect of the present disclosure provides a driving method for the shift register described above, including a first stage, turning on the pull-up control module, turning on the pull-up module, turning on the pull-down control module, turning off the pull-down module, and outputting a high electric level by the output terminal, a second stage, turning off the pull-up control module, turning on the pull-up module, turning on the pull-down control module, turning off the pull-down module, and outputting a high electric level by the output terminal, a third stage, turning off the pull-up control module, turning on the pull-up module, turning on the pull-down control module, turning on the pull-down module, and outputting a high electric level by the output terminal, a fourth stage, turning on the pull-up control module, turning off the pull-up module, turning off the pull-down control module, turning on the pull-down module, and outputting a low electric level by the output terminal, a fifth stage, turning off the pull-up control module, turning off the pull-up module, turning off the pull-down control module, turning on the pull-down module, and outputting a high electric level by the output terminal, and a sixth stage, turning off the pull-up control module, turning off the pull-up module, turning off the pull-down control module, turning on the pull-down module, and outputting a high electric level by the output terminal.

In an embodiment of the present disclosure, the pull-up control module includes a control terminal, a first terminal, and a second terminal. The pull-up module includes a control terminal, a first terminal, and a second terminal. The pull-down control module includes a control terminal, a first terminal, and a second terminal. The pull-down module includes a control terminal, a first terminal, and a second terminal. The control terminal of the pull-up control module is connected to a clock signal terminal, the first terminal of the pull-up control module is connected to a first input terminal, and the second terminal of the pull-up control module is connected to the control terminal of the pull-up module. The first terminal of the pull-up module is connected to a first voltage terminal and the second terminal of the pull-up module is connected to the output terminal. The control terminal of the pull-down control module is connected to the second terminal of the pull-up control module, the first terminal of the pull-down control module is connected to a second input terminal, and the second terminal of the pull-down control module is connected to the control terminal of the pull-down module. The first terminal of the pull-down module is connected to a second voltage terminal, and the second terminal of the pull-down module is connected to the output terminal. In the first stage, the signal at the first input terminal is valid, the signal at the second input terminal is invalid, the signal at the clock signal terminal is valid, the first voltage terminal is at a high electric level and the second voltage terminal is at a low electric level. In the second stage, the signal at the first input terminal is valid, the signal at the second input terminal is invalid, the signal at the clock signal terminal is invalid, the first voltage terminal is at a high electric level and the second voltage terminal is at a high electric level. In the third stage, the signal at the first input terminal is invalid, the signal at the second input terminal is valid, the signal at the clock signal terminal is invalid, the first voltage terminal is at a high electric level and the second voltage terminal is at a high electric level. In the fourth stage, the signal at the first input terminal is invalid, the signal at the second input terminal is invalid, the signal at the clock signal terminal is valid, the first voltage terminal is at a high electric level and the second voltage terminal is at a low electric level. In the fifth stage, the signal at the first input terminal is invalid, the signal at the second input terminal is invalid, the signal at the clock signal terminal is invalid, the first voltage terminal is at a high electric level and the second voltage terminal is at a high electric level. In the sixth stage, the signal at the first input terminal is valid, the signal at the second input terminal is invalid, the signal at the clock signal terminal is invalid, the first voltage terminal is at a high electric level and the second voltage terminal is at a high electric level.

The shift register and the driving method, the driving circuit, the array substrate, and the display device according to the embodiments of the present disclosure, simplify the circuit structure and can realize a narrow bezel or a screen with ultra-high resolution.

BRIEF DESCRIPTION OF THE DRAWINGS

In order to more clearly illustrate the technical solutions of the embodiments of the present disclosure, the drawings of the embodiments will be briefly described below. It should be understood that the drawings described below merely relate to some embodiments of the present disclosure rather than limiting the present disclosure, in which.

DETAILED DESCRIPTION

To make the technical solutions and advantages of the embodiments of the present disclosure more clear, the technical solutions of the embodiments of the present disclosure will be clearly and completely described below in conjunction with the drawings. Obviously, the embodiments described are part of embodiments of the present disclosure, instead of all the embodiments. Based on the described embodiments of the present disclosure, all other embodiments obtained by those skilled in the art without creative work also fall within the scope of protection sought for by the present disclosure.

Figure 1:
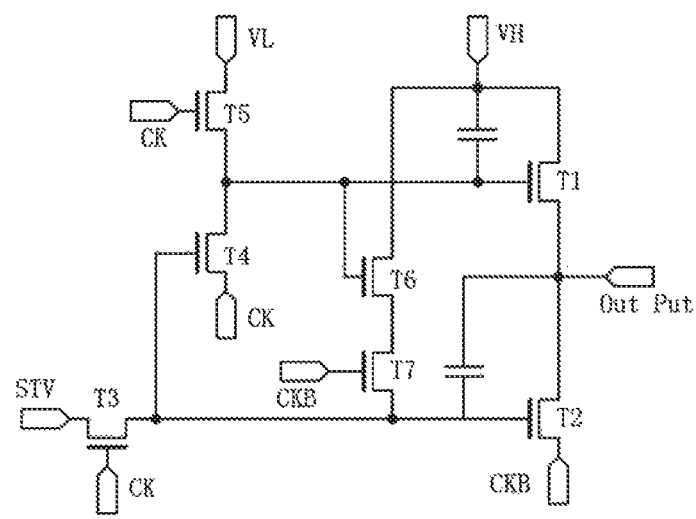
FIG. 1 is a schematic circuit diagram of a shift register of AMOLED in the prior art.
Figure 2:
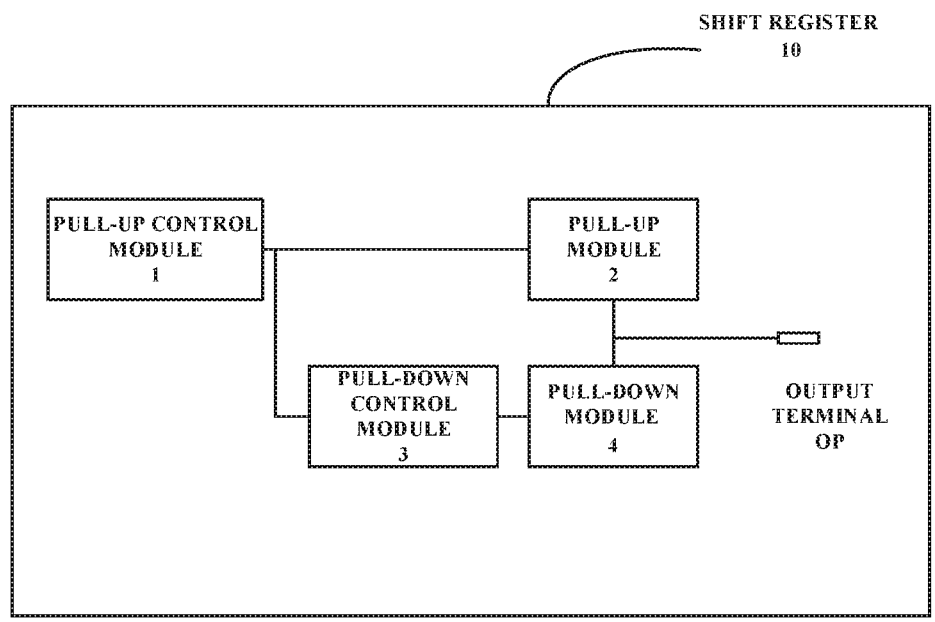
FIG. 2 is a block diagram of a shift register according to a first embodiment of the present disclosure.

FIG. 2 is a block diagram of a shift register according to a first embodiment of the present disclosure. As shown in FIG. 2, in the embodiment of the present disclosure, the shift register 10 includes a pull-up control module 1, a pull-up module 2, a pull-down control module 3, a pull-down module 4 and an output terminal OP. The pull-up control module 1 is connected to the pull-up module 2, and the pull-up control module 1 is configured to control the pull-up module 2 to pull up the electric level of the output terminal OP. The pull-up module 2 is connected to the output terminal OP, and the pull-up module 2 is configured to pull up the electric level of the output terminal OP. The pull-down control module 3 is connected to the pull-down module 4, and the pull-down control module 3 is configured to control the pull-down module 4 to pull down the electric level of the output terminal OP. The pull-down module 4 is connected to the output terminal OP, and the pull-down module 4 is configured to pull down the electric level of the output terminal OP.

In the embodiment of the present disclosure, the shift register is implemented using the pull-up control module 1, the pull-up module 2, the pull-down control module 3, the pull-down module 4, and the output terminal OP, thereby simplifying the circuit structure.

Figure 3:
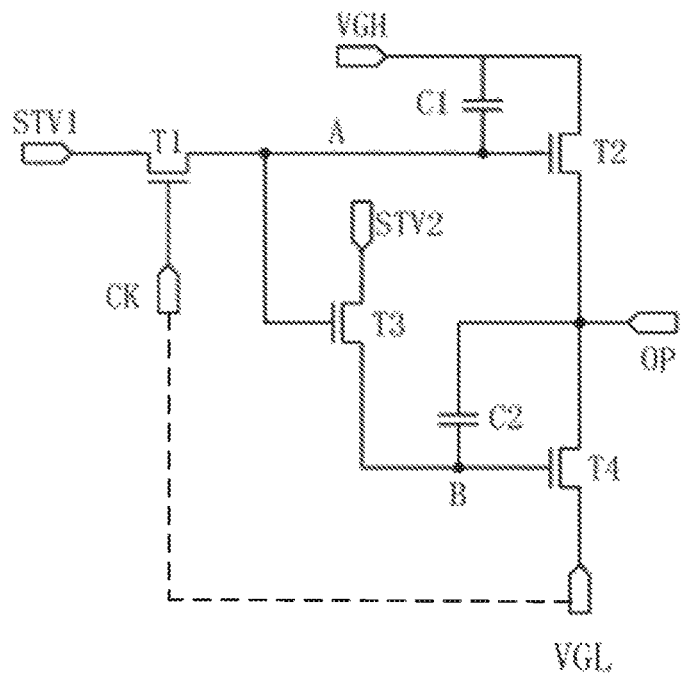
FIG. 3 is a schematic circuit diagram of the shift register in FIG. 2.

FIG. 3 is a schematic circuit diagram of the shift register shown in FIG. 2. In an embodiment of the present disclosure, the pull-up control module 1 includes a control terminal, a first terminal, and a second terminal. Specifically, the pull-up control module 1 includes a first transistor T1. The control terminal of the first transistor T1 is the control terminal of the pull-up control module 1, the first terminal of the first transistor T1 is the first terminal of the pull-up control module 1, and the second terminal of the first transistor T1 is the second terminal of the pull-up control module 1.

The pull-up module 2 includes a control terminal, a first terminal, and a second terminal. Specifically, the pull-up module 2 includes a second transistor T2 and a first capacitor C1. The control terminal of the second transistor T2 is the control terminal of the pull-up module 2, the first terminal of the second transistor T2 is the first terminal of the pull-up module 2, and the second terminal of the second transistor T2 is the second terminal of the pull-up module 2. The first capacitor C1 is connected between the control terminal and first terminal of the second transistor T2.

The pull-down control module 3 includes a control terminal, a first terminal, a second terminal, and a third terminal. Specifically, the pull-down control module 3 includes a third transistor T3. The control terminal of the third transistor T3 is the control terminal of the pull-down control module 3, the first terminal of the third transistor T3 is the first terminal of the pull-down control module 3, and the second terminal of the third transistor T3 is the second terminal of the pull-down control module 3.

The pull-down module 4 includes a control terminal, a first terminal, and a second terminal. Specifically, the pull-down module 4 includes a fourth transistor T4 and a second capacitor C2. The control terminal of the fourth transistor T4 is the control terminal of the pull-down module 4, the first terminal of the fourth transistor T4 is the first terminal of the pull-down module 4, the second terminal of the fourth transistor T4 is the second terminal of the pull-down module 4. The second capacitor C2 is connected between the control terminal and second terminal of the fourth transistor T4.

In addition, the control terminal of the pull-up control module 1 is connected to a clock signal terminal CK, the first terminal of the pull-up control module 1 is connected to a first input terminal STV1, and the second terminal of the pull-up control module 1 is connected to the control terminal of the pull-up module 2. The first terminal of the pull-up module 2 is connected to a first voltage terminal VGH and the second terminal of the pull-up module 2 is connected to the output terminal OP. The control terminal of the pull-down control module 3 is connected to the second terminal of the pull-up control module 1, the first terminal of the pull-down control module 3 is connected to a second input terminal STV2, and the second terminal of the pull-down control module 3 is connected to the control terminal of the pull-down module 4. The first terminal of the pull-down module 4 is connected to a second voltage terminal VGL, and the second terminal of the pull-down module 4 is connected to the output terminal OP.

In the embodiment of the present disclosure, the pull-up control module 1, the pull-up module 2, the pull-down control module 3, and the pull-down module 4 are implemented using a transistor, so that the circuit structure is simplified.

Figure 4:
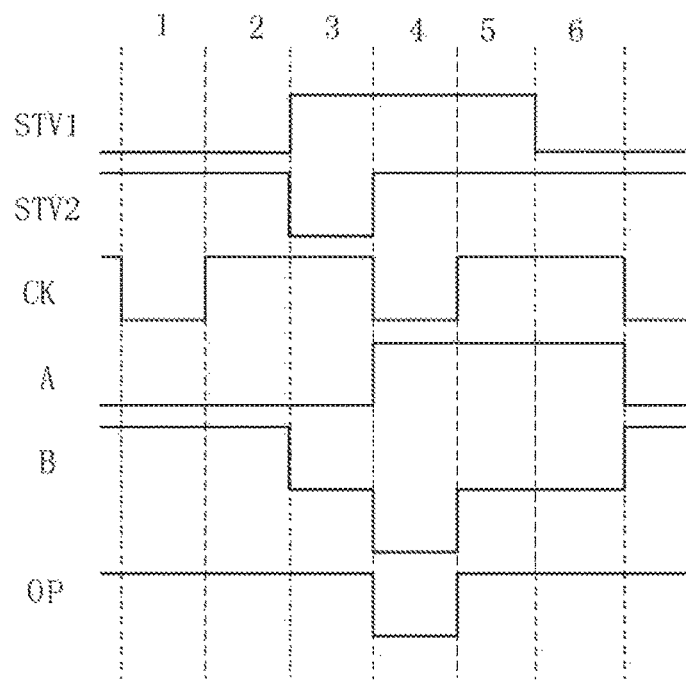
FIG. 4 is a timing chart of the shift register shown in FIG. 3.

FIG. 4 is a timing chart of the shift register shown in FIG. 3. In the embodiment of the present disclosure, the driving method of the shift register is as follows.

In the first stage, the signal at the first input terminal STV1 is valid, the signal at the second input terminal STV2 is invalid, the signal at the clock signal terminal CK is valid, the first voltage terminal VGH is at a high electric level and the second voltage terminal VGL is at a low electric level. The pull-up control module 1 is turned on, the pull-up module 2 is turned on, the pull-down control module 3 is turned on, and the pull-down module 4 is turned off. The voltage at a first node A is valid, and the voltage at a second node B is invalid. The output terminal OP outputs a high electric level. The first node A is the connection point connecting the second terminal of the pull-up control module 1 and the control terminal of the pull-up module 2, and the second node B is the connection point connecting the second terminal of the pull-down control module 3 and the control terminal of the pull-down module 4.

In the second stage, the signal at the first input terminal STV1 is valid, the signal at the second input terminal STV2 is invalid, the signal at the clock signal terminal CK is invalid, the first voltage terminal VGH is at a high electric level and the second voltage terminal VGL is at a high electric level. The pull-up control module 1 is turned off, the pull-up module 2 is turned on, the pull-down control module 3 is turned on, and the pull-down module 4 is turned off. The voltage at the first node A is valid, and the voltage at the second node B is invalid. The output terminal OP outputs a high electric level.

In the third stage, the signal at the first input terminal STV1 is invalid, the signal at the second input terminal STV2 is valid, the signal at the clock signal terminal CK is invalid, the first voltage terminal VGH is at a high electric level and the second voltage terminal VGL is at a high electric level. The pull-up control module 1 is turned off, the pull-up module 2 is turned on, the pull-down control module 3 is turned on, and the pull-down module 4 is turned on. The voltage at the first node A is valid, and the voltage at the second node B is valid. The output terminal OP outputs a high electric level.

In the third stage, when the pull-down module 4 becomes being turned on from being turned off, there will be a transition stage of being not completely turned on, and if the output terminal OP outputs a low electric level at this stage, the expected output signal will not be obtained. Therefore, in the embodiment of the present disclosure, in the third stage, the second voltage terminal VGL will be caused at a high electric level, and the output terminal OP outputs a high electric level.

In the fourth stage, the signal at the first input terminal STV1 is invalid, the signal at the second input terminal STV2 is invalid, the signal at the clock signal terminal CK is valid, the first voltage terminal VGH is at a high electric level and the second voltage terminal VGL is at a low electric level. The pull-up control module 1 is turned on, the pull-up module 2 is turned off, the pull-down control module 3 is turned off, and the pull-down module 4 is turned on. The voltage at the first node A is invalid, and the voltage at the second node B is valid. The output terminal OP outputs a low electric level.

In the fourth stage, the pull-down module 4 is completely turned on, and in a case where the second capacitor C2 is included, due to bootstrapping of the second capacitor C2, the absolute value of the voltage of the second node B (i.e., the control terminal of the pull-down module 4) is caused to be far greater than the absolute value of the turn-on threshold voltage of the pull-down module 4, ensuring well the ON state of the pull-down module 4. Therefore, in the embodiment of the present disclosure, in the fourth stage, the second voltage terminal VGL will be made at a low electric level, and the output terminal OP outputs a low electric level.

In the fifth stage, the signal at the first input terminal STV1 is invalid, the signal at the second input terminal STV2 is invalid, the signal at the clock signal terminal CK is invalid, the first voltage terminal VGH is at a high electric level and the second voltage terminal VGL is at a high electric level. The pull-up control module 1 is turned off, the pull-up module 2 is turned off, the pull-down control module 3 is turned off, and the pull-down module 4 is turned on. The voltage at the first node A is invalid, and the voltage at the second node B is valid. The output terminal OP outputs a high electric level.

In the sixth stage, the signal at the first input terminal STV1 is valid, the signal at the second input terminal STV2 is invalid, the signal at the clock signal terminal CK is invalid, the first voltage terminal VGH is at a high electric level and the second voltage terminal VGL is at a high electric level. The pull-up control module 1 is turned off, the pull-up module 2 is turned off, the pull-down control module 3 is turned off, and the pull-down module 4 is turned on. The voltage at the first node A is invalid, and the voltage at the second node B is valid. The output terminal OP outputs a high electric level.

In an embodiment of the present disclosure, for convenience of description, the description is given by taking the output terminal OP outputting a low-electric level pulse signal as an example, but the present disclosure is not limited thereto. For example, if the electric levels of the first voltage terminal VGH and the second voltage terminal VGL are reversed at each stage, the output terminal OP can output an opposite high-electric level pulse signal. Thus, the shift register provided according to the embodiment of the present disclosure can provide different signals to the pixel circuit without changing the circuit structure.

In the above description, the signal/voltage being "valid" means that when the signal/voltage is applied to the control terminal of the corresponding module in the shift register it can turn on the module, and the signal/voltage being "invalid" means that when the signal/voltage is applied to the control terminal of the corresponding module in the shift register it can turn off the module. As shown in FIG. 3, in the embodiment of the present disclosure, for convenience of description, the description is given by taking the transistor in the modules of the shift register being a P-type transistor as an example, and in that case, the valid signal/voltage is a low electric level signal/voltage, the invalid signal/voltage is a high electric level signal/voltage, but the present disclosure is not limited thereto. For example, the transistor in the modules of the shift register may also be an N-type transistor, and in that case, the valid signal/voltage is a high electric level signal/voltage, and the invalid signal/voltage is a low electric level signal/voltage. Thus, the shift register provided according to the embodiment of the present disclosure can use different types of transistors without changing the circuit structure.

In addition, in an embodiment of the present disclosure, since the state of the second voltage terminal VGL is the same as that of the clock signal terminal CK, the second voltage terminal VGL may be connected to the clock signal terminal CK. This further simplifies the circuit structure.

Figure 5:
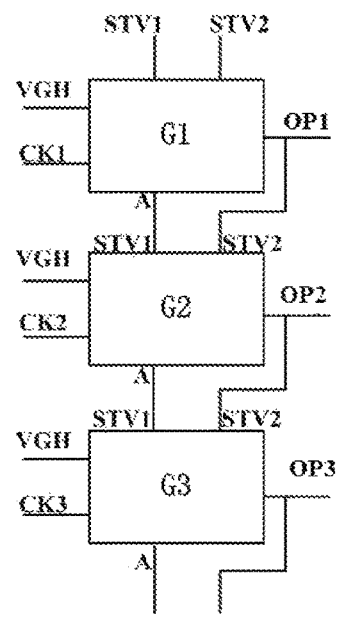
FIG. 5 is a schematic structural diagram of a gate driving circuit according to a second embodiment of the present disclosure.

FIG. 5 is a schematic structural diagram of a gate driving circuit according to a second embodiment of the present disclosure. The gate driving circuit includes a plurality of cascaded said shift registers 10, and the output terminal OP of the shift register 10 is configured to provide a gate driving signal to the corresponding pixel circuit. Where, the pull-up control module 1 and the output terminal OP of a shift register 10 at one stage are connected to a shift register 10 at next stage.

Specifically, the first node A of the shift register 10 at one stage is connected to the first input terminal STV1 of the shift register at next stage, and the output terminal OP of the shift register 10 at one stage is connected to the second input terminal STV2 of the shift register 10 at next stage.

Figure 6:
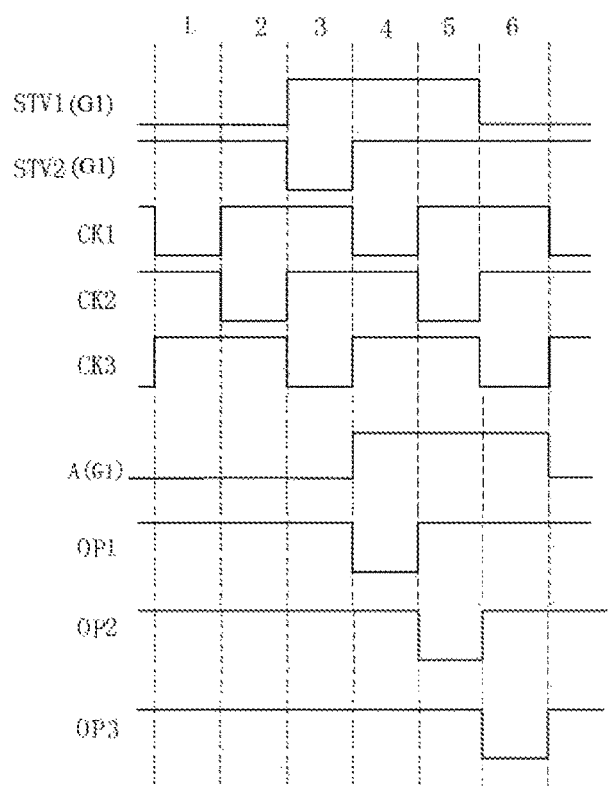
FIG. 6 is a timing chart of the gate driving circuit shown in FIG. 5.

FIG. 6 is a timing chart of the gate driving circuit shown in FIG. 5. As shown in FIG. 6, three clock signals are applied to the clock signal terminals CK1, CK2 and CK3 of three cascaded shift registers 10 (represented by G1, G2 and G3), respectively. The three clock signals are the same in signal waveform and differ from each other by ⅓ clock cycle in the timing. For a further cascaded shift register 10 (e.g., G4, G5, G6, . . . ), the required clock signal is exactly the same as the clock signal received by CK1, CK2 and CK3. Thus, in the embodiment of the present disclosure, the three clock signals can meet the needs of all the shift registers in the gate driving circuit. The three clock signals can be from the same clock source and get different timing through a delay circuit. It is understandable that the number of clock sources may be greater than one in order to avoid overloading the clock sources.

In an embodiment of the present disclosure, there is further provided an array substrate including the gate driving circuit described above.

In an embodiment of the present disclosure, there is further provided a display device including the above-described array substrate. The display device may be any product or component having a display function such as a liquid crystal panel, an electronic paper, an OLED panel, a mobile phone, a tablet computer, a television set, a monitor, a notebook computer, a digital photo frame, a navigator, or the like.

It is to be understood that the above embodiments are merely exemplary embodiments for the purpose of illustrating the principles of the present disclosure, but the present disclosure is not limited thereto. Those of ordinary skill in the art may make various variants and improvements without departing from the spirit and essence of the disclosure, which are also considered to be within the scope of protection sought for by the present disclosure.

What is claimed is:

1. A shift register comprising:
   a pull-up control module;
   a pull-up module;
   a pull-down control module;
   a pull-down module; and
   an output terminal;
   wherein the pull-up control module is connected to the pull-up module and configured to control the pull-up module to pull up the electric level of the output terminal;
   wherein the pull-up module is connected to the output terminal and configured to pull up the electric level of the output terminal;
   wherein the pull-down control module is connected to the pull-down module and configured to control the pull-down module to pull down the electric level of the output terminal;
   wherein the pull-down module is connected to the output terminal and configured to pull down the electric level of the output terminal;
   wherein the pull-up control module comprises a control terminal, a first terminal, and a second terminal, wherein the pull-up module comprises a control terminal, a first terminal, and a second terminal, wherein the pull-down control module comprises a control terminal, a first terminal, and a second terminal, and wherein the pull-down module comprises a control terminal, a first terminal and a second terminal;
   wherein the control terminal of the pull-up control module is connected to a clock signal terminal, the first terminal of the pull-up control module is connected to a first input terminal, and the second terminal of the pull-up control module is connected to the control terminal of the pull-up module;
   wherein the first terminal of the pull-up module is connected to a first voltage terminal, and the second terminal of the pull-up module is connected to the output terminal;
   wherein the control terminal of the pull-down control module is connected to the second terminal of the pull-up control module, the first terminal of the pull-down control module is connected to a second input terminal, and the second terminal of the pull-down control module is connected to the control terminal of the pull-down module;
   wherein the first terminal of the pull-down module is directly connected to a second voltage terminal, and the second terminal of the pull-down module is directly connected to the output terminal;
   wherein the pull-down control module comprises a third transistor, wherein a control terminal of the third transistor is the control terminal of the pull-down control module, wherein a first terminal of the third transistor is the first terminal of the pull-down control module, wherein a second terminal of the third transistor is the second terminal of the pull-down control module, wherein the control terminal of the third transistor is directly connected to the second terminal of the pull-up control module and the control terminal of the pull-up module, and wherein the first terminal of the third transistor is directly connected to the second input terminal; and wherein the second terminal of the third transistor is directly connected to the control terminal of the pull-down module.

2. The shift register according to claim 1, wherein the second voltage terminal is connected to the clock signal terminal.

3. The shift register according to claim 1, wherein the pull-up control module comprises a first transistor, wherein a control terminal of the first transistor is the control terminal of the pull-up control module, wherein a first terminal of the first transistor is the first terminal of the pull-up control module, and wherein a second terminal of the first transistor is the second terminal of the pull-up control module.

4. The shift register according to claim 1, wherein the pull-up module comprises a second transistor and a first capacitor, wherein a control terminal of the second transistor is the control terminal of the pull-up module, wherein a first terminal of the second transistor is the first terminal of the pull-up module, and wherein a second terminal of the second transistor is the second terminal of the pull-up module, and wherein the first capacitor is connected between the control terminal and the first terminal of the second transistor.

5. The shift register according to claim 1, wherein the pull-down module comprises a fourth transistor and a second capacitor, wherein a control terminal of the fourth transistor is the control terminal of the pull-down module, wherein a first terminal of the fourth transistor is the first terminal of the pull-down module, wherein a second terminal of the fourth transistor is the second terminal of the pull-down module, and wherein the second capacitor is connected between the control terminal and the second terminal of the fourth transistor.

6. A gate driving circuit comprising a plurality of shift registers connected in cascade;
   wherein the shift register of the plurality of shift registers comprises:
   a pull-up control module;
   a pull-up module;
   a pull-down control module;
   a pull-down module; and
   an output terminal;
   wherein the pull-up control module is connected to the pull-up module and configured to control the pull-up module to pull up the electric level of the output terminal;
   wherein the pull-up module is connected to the output terminal and configured to pull up the electric level of the output terminal;
   wherein the pull-down control module is connected to the pull-down module and configured to control the pull-down module to pull down the electric level of the output terminal;
   wherein the pull-down module is connected to the output terminal and configured to pull down the electric level of the output terminal;
   wherein the pull-up control module comprises a control terminal, a first terminal, and a second terminal, wherein the pull-up module comprises a control terminal, a first terminal, and a second terminal, wherein the pull-down control module comprises a control terminal, a first terminal, and a second terminal, and wherein the pull-down module comprises a control terminal, a first terminal, and a second terminal;
   wherein the control terminal of the pull-up control module is connected to a clock signal terminal, the first terminal of the pull-up control module is connected to a first input terminal, and the second terminal of the pull-up control module is connected to the control terminal of the pull-up module;

wherein the first terminal of the pull-up module is connected to a first voltage terminal, and the second terminal of the pull-up module is connected to the output terminal;

wherein the control terminal of the pull-down control module is connected to the second terminal of the pull-up control module, the first terminal of the pull-down control module is connected to a second input terminal, and the second terminal of the pull-down control module is connected to the control terminal of the pull-down module;

wherein the pull-down control module comprises a third transistor, wherein a control terminal of the third transistor is the control terminal of the pull-down control module, wherein a first terminal of the third transistor is the first terminal of the pull-down control module, wherein a second terminal of the third transistor is the second terminal of the pull-down control module, wherein the control terminal of the third transistor is directly connected to the second terminal of the pull-up control module and the control terminal of the pull-up module, and wherein the first terminal of the third transistor is directly connected to the second input terminal;

wherein the first terminal of the pull-down module is directly connected to a second voltage terminal, and the second terminal of the pull-down module is directly connected to the output terminal;

wherein the second terminal of the pull-up control module of the shift register at one stage is connected to the first input terminal of the shift register at next stage, and the output terminal of the shift register at one stage is connected to the second input terminal of the shift register at next stage; and wherein the output terminal of the shift register is configured to provide a gate driving signal to a corresponding pixel circuit, and wherein the pull-up control module and the output terminal of a shift register at one stage are connected to a shift register at next stage.

7. An array substrate comprising the gate driving circuit according to claim 6.

8. A display device comprising the array substrate according to claim 7.

9. The gate driving circuit according to claim 6, wherein the second voltage terminal is connected to the clock signal terminal.

10. The gate driving circuit according to claim 6, wherein the pull-up control module comprises a first transistor, wherein a control terminal of the first transistor is the control terminal of the pull-up control module, wherein a first terminal of the first transistor is the first terminal of the pull-up control module, and wherein a second terminal of the first transistor is the second terminal of the pull-up control module.

11. The gate driving circuit according to claim 6, wherein the pull-up module comprises a second transistor and a first capacitor, wherein a control terminal of the second transistor is the control terminal of the pull-up module, wherein a first terminal of the second transistor is the first terminal of the pull-up module, and wherein a second terminal of the second transistor is the second terminal of the pull-up module, and wherein the first capacitor is connected between the control terminal and the first terminal of the second transistor.

12. The gate driving circuit according to claim 6, wherein the pull-down control module comprises a third transistor, wherein a control terminal of the third transistor is the control terminal of the pull-down control module, wherein a first terminal of the third transistor is the first terminal of the pull-down control module, and wherein a second terminal of the third transistor is the second terminal of the pull-down control module.

13. The gate driving circuit according to claim 6, wherein the pull-down module comprises a fourth transistor and a second capacitor, wherein a control terminal of the fourth transistor is the control terminal of the pull-down module, wherein a first terminal of the fourth transistor is the first terminal of the pull-down module, wherein a second terminal of the fourth transistor is the second terminal of the pull-down module, and wherein the second capacitor is connected between the control terminal and the second terminal of the fourth transistor.

14. A driving method for a shift register, wherein the shift register comprises:
a pull-up control module;
a pull-up module;
a pull-down control module;
a pull-down module; and
an output terminal;
wherein the pull-up control module is connected to the pull-up module and configured to control the pull-up module to pull up the electric level of the output terminal;
wherein the pull-up module is connected to the output terminal and configured to pull up the electric level of the output terminal;
wherein the pull-down control module is connected to the pull-down module and configured to control the pull-down module to pull down the electric level of the output terminal;
wherein the pull-down module is connected to the output terminal and configured to pull down the electric level of the output terminal;
wherein the pull-up control module comprises a control terminal, a first terminal, and a second terminal, wherein the pull-up module comprises a control terminal, a first terminal, and a second terminal, wherein the pull-down control module comprises a control terminal, a first terminal, and a second terminal, and wherein the pull-down module comprises a control terminal, a first terminal, and a second terminal;
wherein the control terminal of the pull-up control module is connected to a clock signal terminal, the first terminal of the pull-up control module is connected to a first input terminal, and the second terminal of the pull-up control module is connected to the control terminal of the pull-up module;
wherein the first terminal of the pull-up module is connected to a first voltage terminal, and the second terminal of the pull-up module is connected to the output terminal;
wherein the control terminal of the pull-down control module is connected to the second terminal of the pull-up control module, the first terminal of the pull-down control module is connected to a second input terminal, and the second terminal of the pull-down control module is connected to the control terminal of the pull-down module;

wherein the first terminal of the pull-down module is connected to a second voltage terminal, and the second terminal of the pull-down module is connected to the output terminal;

wherein the pull-down control module comprises a third transistor, wherein a control terminal of the third transistor is the control terminal of the pull-down control module, wherein a first terminal of the third transistor is the first terminal of the pull-down control module, wherein a second terminal of the third transistor is the second terminal of the pull-down control module; and wherein the second terminal of the third transistor is directly connected to the control terminal of the pull-down module;

the method comprising:

in a first stage, turning on the pull-up control module, turning on the pull-up module, turning on the pull-down control module, turning off the pull-down module, and outputting a high electric level by the output terminal;

in a second stage, turning off the pull-up control module, turning on the pull-up module, turning on the pull-down control module, turning off the pull-down module, and outputting a high electric level by the output terminal;

in a third stage, turning off the pull-up control module, turning on the pull-up module, turning on the pull-down control module, turning on the pull-down module, and outputting a high electric level by the output terminal;

in a fourth stage, turning on the pull-up control module, turning off the pull-up module, turning off the pull-down control module, turning on the pull-down module, and outputting a low electric level by the output terminal;

in a fifth stage, turning off the pull-up control module, turning off the pull-up module, turning off the pull-down control module, turning on the pull-down module, and outputting a high electric level by the output terminal; and in a sixth stage, turning off the pull-up control module, turning off the pull-up module, turning off the pull-down control module, turning on the pull-down module, and outputting a high electric level by the output terminal.

15. The driving method according to claim 14, wherein in the first stage, the signal at the first input terminal is valid, the signal at the second input terminal is invalid, the signal at the clock signal terminal is valid, the first voltage terminal is at a high electric level, and the second voltage terminal is at a low electric level;

wherein in the second stage, the signal at the first input terminal is valid, the signal at the second input terminal is invalid, the signal at the clock signal terminal is invalid, the first voltage terminal is at a high electric level, and the second voltage terminal is at a high electric level;

wherein in the third stage, the signal at the first input terminal is invalid, the signal at the second input terminal is valid, the signal at the clock signal terminal is invalid, the first voltage terminal is at a high electric level, and the second voltage terminal is at a high electric level;

wherein in the fourth stage, the signal at the first input terminal is invalid, the signal at the second input terminal is invalid, the signal at the clock signal terminal is valid, the first voltage terminal is at a high electric level, and the second voltage terminal is at a low electric level;

wherein in the fifth stage, the signal at the first input terminal is invalid, the signal at the second input terminal is invalid, the signal at the clock signal terminal is invalid, the first voltage terminal is at a high electric level, and the second voltage terminal is at a high electric level; and wherein in the sixth stage, the signal at the first input terminal is valid, the signal at the second input terminal is invalid, the signal at the clock signal terminal is invalid, the first voltage terminal is at a high electric level, and the second voltage terminal is at a high electric level.

* * * * *